United States Patent [19]

Walker

[11] Patent Number: 5,046,141
[45] Date of Patent: Sep. 3, 1991

[54] LOW CONDUCTIVITY MOUNTING STUD AND A METHOD AND APPARATUS FOR FASTENING AN ELECTRONIC COMPONENT USING THE SAME

[75] Inventor: Richard E. Walker, Pinehurst, Tex.
[73] Assignee: Compaq Computer Corporation, Houston, Tex.
[21] Appl. No.: 154,207
[22] Filed: Feb. 10, 1988
[51] Int. Cl.$^5$ .................. H01L 23/40; F16B 21/18; F16B 19/00
[52] U.S. Cl. ........................ 174/1; 29/525.1; 174/16.3; 174/138 D; 411/352; 411/500; 411/525; 411/904
[58] Field of Search ............ 174/16.3, 138 D, 159, 174/1; 411/352, 500, 525, 526, 527, 528, 904; 29/525.1; 357/81

[56] References Cited

U.S. PATENT DOCUMENTS

| 913,024 | 2/1909 | Meacham | 411/526 X |
| 1,056,392 | 3/1913 | Barr et al. | 174/153 G |
| 1,890,348 | 12/1932 | Weatherhead, Jr. | 411/352 |
| 2,337,267 | 12/1943 | Owen | 411/528 X |
| 2,344,570 | 3/1944 | Tinnerman | 411/525 |
| 3,248,471 | 4/1966 | Danchuk et al. | 174/16.3 |
| 3,391,242 | 7/1968 | Sudges | 174/16.3 |
| 4,215,255 | 7/1980 | Kimblin et al. | 200/144 B |

FOREIGN PATENT DOCUMENTS

| 827795 | 2/1960 | United Kingdom | 174/138 D |
| 2183711 | 6/1987 | United Kingdom | 411/500 |

OTHER PUBLICATIONS

*Modern Ceramic Engineering*, David W. Richerson, Marcel Dekker, Inc. (New York 1982), pp. 10, 18-19, 45-48, 59-60, 72, 109, 112, 133, 138, 256, 386, 397 and 399.

Primary Examiner—Laramie E. Askin
Attorney, Agent, or Firm—Johnson & Gibbs

[57] ABSTRACT

A low conductivity mounting stud for attaching an electronic component to a base structure such as a heat sink eliminates the need for several insulating washers and other insulators around the shaft of the mounting stud. The mounting stud may be composed of ceramic material such as partially stabilized zirconia. The mounting stud is secured with a press-on fastener such as a "Tinnerman nut".

9 Claims, 1 Drawing Sheet

LOW CONDUCTIVITY MOUNTING STUD AND A METHOD AND APPARATUS FOR FASTENING AN ELECTRONIC COMPONENT USING THE SAME

BACKGROUND OF THE INVENTION

The present invention relates to the insulated mounting of an electronic component to a base structure, and more particularly to a low conductivity mounting stud and method for mounting an electronic component such as a transistor to a base structure such as a heat sink that eliminates the need for insulating washers and other insulators.

Semiconductor devices such as transistors and other electronic components often are mounted to base structures such as heat sinks with a mounting stud threaded to a nut. A problem encountered in the prior art is that two or more semiconductor devices are not insulated from one another if both are mounted to the same heat sink, unless insulators are used not only to insulate the device from the heat sink but also to insulate the device from the mounting stud. Typically, the back of the electronic component and the base structure both are electrically conductive. Therefore, when two or more components are mounted to the same base structure, there is a need to insulate each of the electronic components from one another.

In the prior art, an insulating washer generally is used to insulate the head of the mounting stud from the electronic component. Another insulating washer is used to insulate the nut from the heat sink. A mica insulator or layer of thermal grease insulates the electronic component from the heat sink. Additionally, an insulating sleeve is generally used around the shaft of the mounting stud to insulate the shaft from the electronic component and the heat sink. Alternatively, an insulating shoulder washer is used to insulate the head and shaft of the mounting stud.

A problem with the prior art therefore results from the substantial assembly work of numerous small parts including insulating washers and other insulators. Another problem with the prior art results when the washer between the mounting stud and the electronic component is torqued down, and the washer compresses resulting in a torque loss that is needed to hold the transistor firmly against the heat sink.

Other methods of insulated mounting of an electronic component to a heat sink or other base structure include a spring clip which bears on the top surface of the plastic body of the component and is connected to slots in the heat sink on either side of the component. A mica insulator or layer of thermal grease is used to insulate the component from the heat sink.

Thus, a need exists for a low conductivity mounting stud and method for mounting electronic components to heat sinks or other base structures with fewer insulating parts while preventing electrical contact between the components.

SUMMARY OF THE INVENTION

An object of the present invention is to provide a low conductivity mounting stud for mounting electronic components to base structures which is free from the drawbacks of prior art mounting systems described above, and which has highly improved ease of assembly.

Another object of the present invention is to provide a mounting stud for mounting an electronic component to a base structure and eliminating the need for various insulating washers and other insulators used in the prior art. In view of the above object, the present invention provides a mounting stud comprised of low conductivity material such as ceramic or partially stabilized zirconia or other ceramic material. The mounting stud may be secured with the use of a press on fastener such as a "Tinnerman nut". The mounting stud optionally may be provided with a plurality of grooves cut around the outer circumference of at least a portion of the shaft of the mounting stud.

The subject matter of the present invention is particularly pointed out and distinctly claimed in the concluding portion of this specification. However, both the organization and method of operation of the invention, together with further advantages and objects thereof, may best be understood by reference to the following description taken in connection with the accompanying drawings.

DETAILED DESCRIPTION OF THE PREFERRED EMBODIMENT

Figure 1:
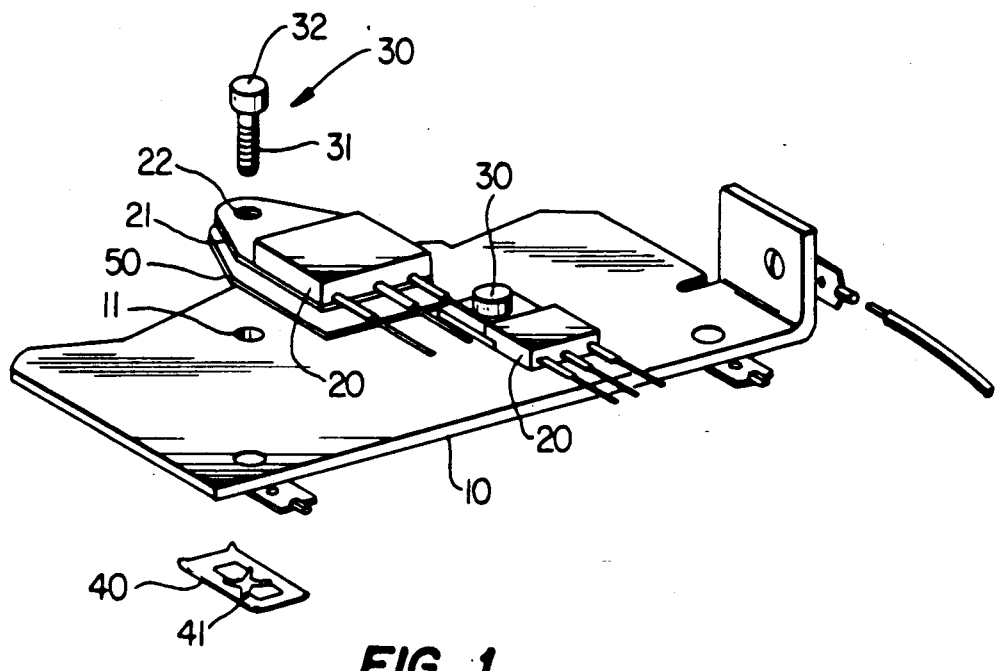
FIG. 1 is a perspective view of the mounting stud and press-on fastener of the present invention in position for fastening an electronic component shown disconnected from a base structure.

Referring to the drawings and particularly to FIG. 1, a portion of the base structure according to the present invention is illustrated. The base structure 10 typically is a heat sink or similar planar structure on which electronic components 20 are mounted. Each electronic component 20 includes an electronic component base or tab 21, the back of which is electrically conductive. When two or more components are mounted to the heat sink, there is a need to insulate each component from the other.

A low conductivity mounting stud 30 is used to mount each electronic component to the base structure. The mounting stud is comprised of a low conductivity ceramic, preferably partially stabilized zirconia. The mounting stud includes a shaft 31 and a head 32. A mica insulator 50 or layer of thermal grease is used to electrically insulate the component from the heat sink.

A press-on fastener 40 such as a "Tinnerman nut" is used to anchor the mounting stud 30 to the heat sink 10. Typically, the press-on fastener includes jaws 41 which grip the shaft of the mounting stud and are biased to urge the head of the mounting stud against the electronic component base 21, thereby assuring that the electronic component is tightly mounted. The shaft 31 of the mounting stud extends through electronic component mounting hole 22, mica insulator 50, and base structure mounting hole 11.

Figure 2:
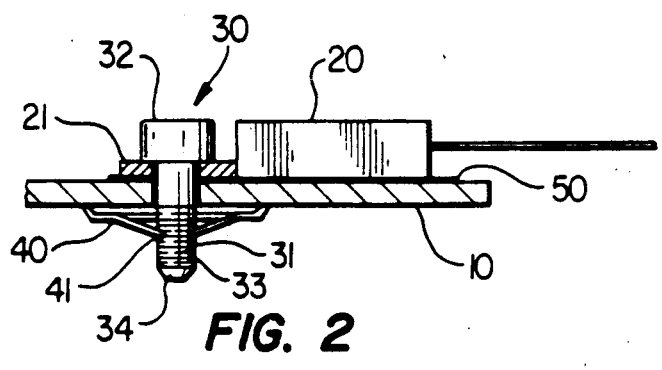
FIG. 2 is a side view partially in section of a mounting stud connecting an electronic component to a base structure according to a preferred embodiment of the present invention.

Now referring to FIG. 2, the low conductivity mounting stud of the present invention is shown in a side view connecting an electronic component to a heat sink. As shown, mounting stud 30 includes shaft 31 and head 32. The shaft 31 extends through base structure mounting hole 11, mica insulator 50 and electronic component hole 22. In a preferred embodiment, the shaft includes grooves 33 which extend around the circumference of at least a portion of the shaft 31. The mounting stud further includes a tapered tip 34. The press-on fastener 40 includes jaws 41 which are biased against the shaft 31 so that the mounting stud may not be loosened by vibration or the like.

Figure 3:
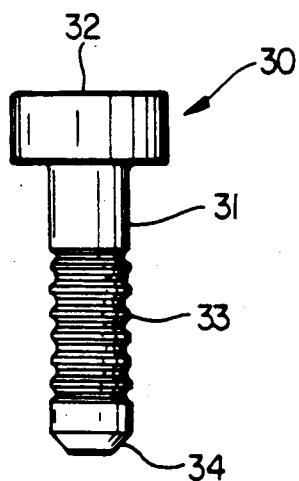
FIG. 3 is a side view of a mounting stud according to a first embodiment of the present invention.

Now referring to FIG. 3, the low conductivity mounting stud is shown in a side view. Mounting stud 30 includes shaft 31 and head 32. The tip 34 of the mounting stud is preferably tapered. Further, in a preferred embodiment, a plurality of grooves 33 are included in at least a portion of the shaft 31.

Figure 4:
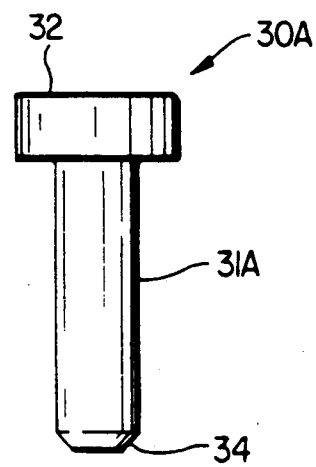
FIG. 4 is a side view of a mounting stud according to a second embodiment of the invention.

In FIG. 4, a second embodiment of the present invention is shown wherein the mounting stud 30A includes a shaft 31A without grooves or other friction enhancement, i.e., non-slip, means.

The present invention eliminates the need for insulating washers and insulators to insulate the mounting stud itself from the electronic component and base. It is contemplated within the present invention to use various low conductivity materials, including ceramics, to make the low conducting mounting stud. These materials include partially stabilized zirconia which is intended to keep cracks from propagating in the mounting stud.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A mounting stud for attaching an electronic component to a base structure comprising:
    a cylindrical shaft with a head at a first end thereof and a tapered portion at a second end thereof, the shaft, head and tapered portion being formed of partially stabilized zirconia.

2. The mounting stud of claim 1 wherein a plurality of grooves are cut around the outer circumference of at least a portion of the shaft.

3. An apparatus for fastening an electronic component to a base structure comprising:
    a member formed of partially stabilized zirconia, said member having a first end and a second end and a cylindrical shaft therebetween, and a head at the first end thereof, the shaft adapted to be inserted through a first mounting hole in a portion of an electronic component, the second end of the shaft adapted to extend through a corresponding second mounting hole in a base structure; and
    a press-on fastener engageable to the shaft, the fastener being biased to urge the head against the electronic component when the shaft is positioned through aligned mounting holes in the electronic component and the base structure with the head positioned against the electronic component.

4. The apparatus of claim 3 wherein the shaft includes non-slip means adapted for frictional engagement with the press-on fastener.

5. The apparatus of claim 4 wherein the non-slip means comprises grooves cut around the circumference of the shaft.

6. The apparatus of claim 3 wherein the second end of the shaft is tapered.

7. A method for fastening a semiconductor device to a heat sink comprising the steps of:
    positioning a low conductivity shaft through aligned holes in a semiconductor device and a heat sink, said low conductivity shaft formed of partially stabilized zirconia; and
    engaging a press-on fastener to one end of the shaft, the fastener biased to urge the semiconductor device against the heat sink.

8. An apparatus for insulatively fastening an electronic component to a base structure comprising:
    a tab member having a top side and an electrically conductive bottom side, said top side including a first section where an electronic component is mountable thereto and a second section having an opening therein;
    a mica insulator attached to the bottom side of said tab member;
    a low conductivity mounting stud formed of partially stabilized zirconia, said low conductivity mounting stud having a shaft with first and second ends and a head at said first end thereof, said shaft inserted through said opening in said tab member and said mica insulator and insertable through an opening in a base structure for mounting said electronic component to said base structure, said head positioned on said top side of said tab member and a first portion of said shaft extendable below a bottom side of said base structure; and
    a press-on fastener engaged to said first portion of said shaft, said press-on fastener urging said head against said top side of said tab member.

9. An apparatus for fastening an electronic component to a base structure in accordance with claim 8 and wherein said shaft further comprises a second portion, positionable above said bottom side of said base structure, said first portion having a plurality of circumferential grooves provided therein and said second portion being grooveless.

* * * * *